(12) United States Patent
Kang et al.

(10) Patent No.: US 9,384,810 B2
(45) Date of Patent: Jul. 5, 2016

(54) MONOLITHIC MULTI-CHANNEL ADAPTABLE STT-MRAM

(75) Inventors: Seung H. Kang, San Diego, CA (US); Xiaochun Zhu, San Diego, CA (US)

(73) Assignee: QULACOMM Incorporated, San Diego, CA (US)

(*) Notice: Subject to any disclaimer, the term of this patent is extended or adjusted under 35 U.S.C. 154(b) by 572 days.

(21) Appl. No.: 13/571,576

(22) Filed: Aug. 10, 2012

(65) Prior Publication Data
US 2014/0043890 A1    Feb. 13, 2014

(51) Int. Cl.
*G11C 11/16* (2006.01)
*G11C 29/02* (2006.01)

(52) U.S. Cl.
CPC ............. *G11C 11/16* (2013.01); *G11C 29/028* (2013.01)

(58) Field of Classification Search
CPC ........................................................ G11C 11/16
USPC .......................................... 365/158, 171, 148
See application file for complete search history.

(56) References Cited

U.S. PATENT DOCUMENTS

| | | | | |
|---|---|---|---|---|
| 2008/0205124 A1* | 8/2008 | Inaba | ............ | G11C 11/16 365/158 |
| 2009/0213644 A1 | 8/2009 | Parkinson | | |
| 2010/0080036 A1* | 4/2010 | Liu et al. | ............ | 365/145 |
| 2010/0124105 A1 | 5/2010 | Wang et al. | | |
| 2010/0191913 A1* | 7/2010 | Chlipala et al. | ............ | 711/122 |
| 2010/0238711 A1* | 9/2010 | Asao | ............ | G11C 8/14 365/148 |
| 2010/0287333 A1 | 11/2010 | Lee | | |
| 2010/0318766 A1* | 12/2010 | Tsuji | ............ | 712/22 |
| 2010/0322020 A1 | 12/2010 | Kim | | |
| 2011/0128073 A1 | 6/2011 | Fukuda | | |
| 2011/0320698 A1 | 12/2011 | Wang | | |
| 2012/0066439 A1 | 3/2012 | Fillingim | | |

OTHER PUBLICATIONS

Clinton W. Smullen, "Relaxing Non-Volatility for Fast and Energy-Efficient STT-RAM Caches", Feb. 2011, High Performance Computer Architecture (HPCA) IEEE 17th International Symposium on, pp. 50-61.*
Clinton W. Smullen, "Designing Giga-scale Memory Systems with STT-RAM", A Dissertation Presented to the Faculty of the School of Engineering and Applied Science, University of Virginia, Dec. 2011.*
International Search Report and Written Opinion—PCT/US2013/054002—ISA/EPO—Nov. 13, 2013.

* cited by examiner

*Primary Examiner* — Hoai V Ho
*Assistant Examiner* — Jay Radke
(74) *Attorney, Agent, or Firm* — Elaine H. Lo (57) ABSTRACT

A monolithic multi-channel resistive memory includes at least one first bank associated with a first channel and tuned according to first device attributes and/or first circuit attributes. The memory also includes at least one second bank associated with a second channel and tuned according to second device attributes and/or second circuit attributes.

19 Claims, 5 Drawing Sheets

MONOLITHIC MULTI-CHANNEL ADAPTABLE STT-MRAM

TECHNICAL FIELD

The present disclosure relates generally to magnetoresistive random-access memory (MRAM) cells. More specifically, the disclosure relates to multi-channel adaptable MRAM.

BACKGROUND

In a conventional memory subsystem, such as a memory subsystem used for computing, different types of standalone memory, such as dynamic random access memory (DRAM) and flash memory (NAND, NOR), are adopted.

DRAM is a high-throughput and low-cost commodity working memory. DRAM, however, is volatile and has a large power consumption.

Hybrid DRAM (e.g., OneDRAM™) is a variant of DRAM, which is a single DRAM die with two ports for serving two processors (e.g., a modem and an application processor). Similar to conventional DRAM, however, hybrid DRAM is volatile and has a large power consumption.

Flash (NAND, NOR) is a storage memory technology which is nonvolatile and low-cost. But, flash is slow and limited in its endurance. Hybrid flash (e.g., NAND memory with an integrated NOR block) is a variant of flash, which couples NOR's performance advantage with NAND's density advantage. Compared with a working memory like DRAM, however, hybrid flash, however is still much slower and limited in its endurance.

None of the conventional memory technologies can simultaneously serve as a working memory and a nonvolatile storage memory. Accordingly, multiple memory chip solutions are provided in a multi-chip package (MCP) or in a system-in-package (SiP). For example, for mobile systems, it is common to have pseudo-static RAM (PSRAM)-NOR or DRAM-NAND that combines multiple memory chips having unique attributes. Still, MCP and SiP have a higher system cost and a larger form factor than a system using a single memory solution.

For various reasons, such as cost, speed and capacity, known types of memory have generic limitations, so that each serves its unique application. Thus, it would be desirable to provide a low-cost memory that provides the benefits of each of the current memory types but does not have the short comings described above. It is also desirable for such memory to be tunable for speed, power, and density.

SUMMARY

According to an aspect of the present disclosure a monolithic multi-channel resistive memory is presented. The memory includes at least one first bank associated with a first channel and tuned according to first device attributes and/or first circuit attributes. The memory also includes at least one second bank associated with a second channel and tuned according to second device attributes and/or second circuit attributes.

According to another aspect, a monolithic multi-channel resistive memory is presented. The memory includes at least one first storage means associated with a first channel and tuned according to first device attributes and/or first circuit attributes. The memory also includes at least one second storage means associated with a second channel and tuned according to second device attributes and/or second circuit attributes.

According to another aspect, a method of associating memory banks with channels in a monolithic multi-channel resistive memory. The method includes associating at least one first bank with a first channel, the at least one first bank tuned according to first device attributes and/or first circuit attributes. The method also includes associating at least one second bank with a second channel, the at least one second bank tuned according to second device attributes and/or second circuit attributes.

According to still another aspect, a method for fabricating memory banks for a monolithic multi-channel resistive memory is presented. The method includes tuning at least one first bank according to first device attributes and/or first circuit attributes. The method also includes tuning at least one second bank according to second device attributes and/or second circuit attributes.

The above has outlined, rather broadly, the features and technical advantages of the present disclosure in order that the detailed description that follows may be better understood. Additional features and advantages of the disclosure will be described below. It should be appreciated by those skilled in the art that this disclosure may be readily used as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure

BRIEF DESCRIPTION OF THE DRAWINGS

The features, nature, and advantages of the present disclosure will become more apparent from the detailed description set forth below when taken in conjunction with the drawings.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Proposed is a monolithic multi-channel spin transfer torque (STT)-MRAM architecture that is tunable for speed, power, and density, and therefore desirable for providing a low cost, universal memory.

Unlike conventional random access memory (RAM) chip technologies, in magnetoresistive RAM (MRAM) data is not stored as electric charge, but is instead stored by magnetic polarization of storage elements. The storage elements are formed from two ferromagnetic layers separated by a tunneling layer. One of the two ferromagnetic layers, which is referred to as the fixed layer or pinned layer, has a magnetization that is fixed in a particular direction. The other ferromagnetic magnetic layer, which is referred to as the free layer, has a magnetization direction that can be altered to represent either "1" when the free layer magnetization is anti-parallel to the fixed layer magnitization or "0" when the free layer magnetization is parallel to the fixed layer magnitization or vice versa. One such device having a fixed layer, a tunneling layer, and a free layer is a magnetic tunnel junction (MTJ). The electrical resistance of an NITS depends on whether the free layer magnetization and fixed layer magnitization are parallel or anti-parallel with each other. A memory device such as MRAM is built from an array of individually addressable MTJs.

It should be noted that MRAM may be referred as resistive memory. Alternatively, a resistive memory may be any memory type that is configurable similar to a MRAM.

STT-MRAM is a type of MRAM. The free layer magnetization of STT-MRAM may be switched by an electrical current that passes through an MTJ. Thus, STT-MRAM is differentiated from conventional MRAM which uses a magnetic field. STT-MRAM is tunable for speed, power, and density. STT-MRAM may be tailored as an alternative to working memories (e.g., DRAM, SRAM) and storage memories (e.g., Flash, ROM). STT-MRAM cells and macros can be fabricated in multiple configurations (e.g., multi-tiered) in a monolithic die without incurring extra process steps and cost. By incorporating multi-channels, a multi-tiered monolithic STT-MRAM may be used as a memory subsystem consisting of different types of memories (e.g., universal memory).

Figure 1:
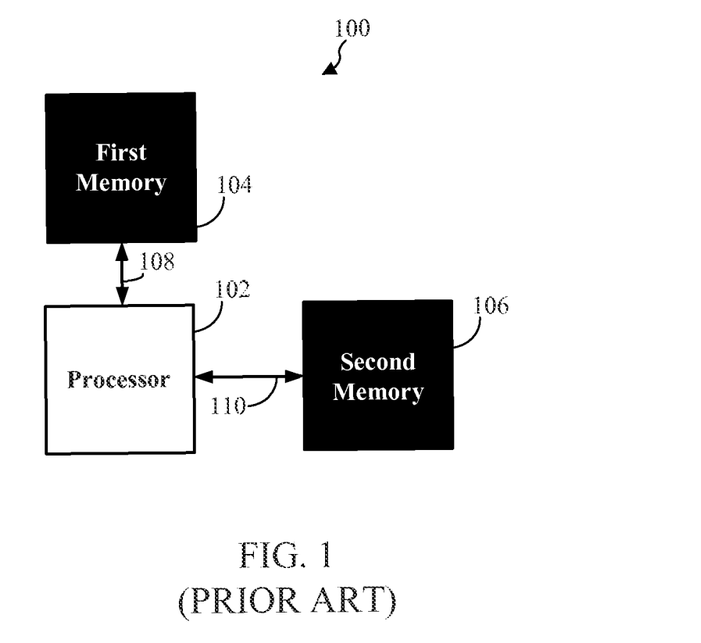
FIG. 1 illustrates a prior art memory system.

Prior art systems may use different types of memory chips configured according to the system specification. FIG. 1 illustrates a prior art system 100 including a processor 102 a first memory type 104, a second memory type 106, a first channel 108, and a second channel 110. The first memory type 104 and the second memory type 106 are different memory chips.

As an example, the processor 102 may be configured as a modem. The modem may use a first memory type 104, such as a pseudo static random access memory (PSRAM) and a second memory type 106, such as a flash memory. The first channel 108 and second channel 110 may be external bus interfaces (EBIs).

As another example, the processor 102 may be configured as a modem or an application processor. The processor 102 may use a first memory type 104, such as a low power double data rate memory (LPDDR) DRAM and a second memory type 106, such as a flash memory. Furthermore, the first channel 108 may be an external bus interface and the second channel 110 may be an external bus interface or an embedded multimedia card (eMMC).

Figure 2:
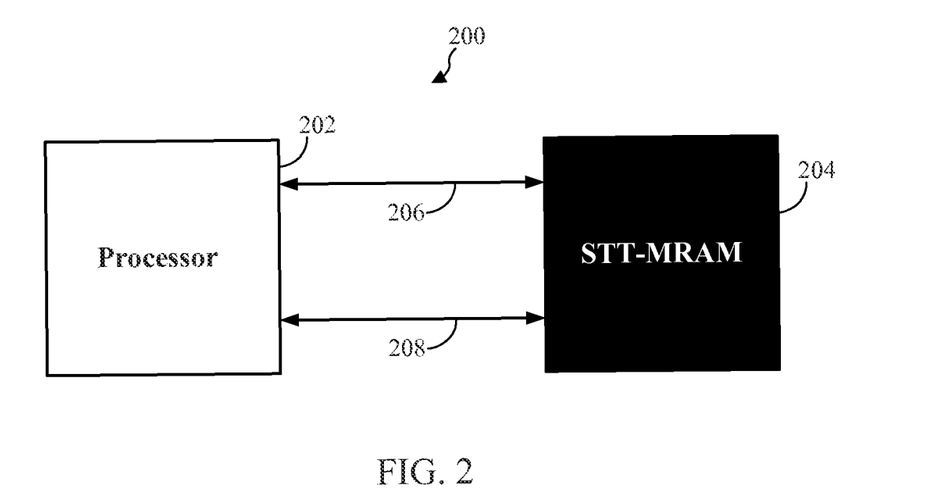
FIG. 2 is a block diagram of a monolithic multi-tiered MRAM system according to an aspect of the disclosure.

The present disclosure provides a monolithic multi-channel multi-tiered MRAM that may be used as a custom memory to replace the various memory types of the prior art systems, such as the prior art system 100. Although the following description is primarily with respect to STT-MRAM, other types of MRAM are also contemplated. As illustrated in FIG. 2, according to the present solution, a system 200 may include a processor 202 coupled with a monolithic multi-channel, multi-tiered STT-MRAM 204. The processor 202 may be any type of processor, such a processor for a modem or an application processor. The processor 202 is coupled to the STT-MRAM 204 via a first channel 206 and a second channel 208. In some aspects of the present disclosure, the STT-MRAM includes sets of memory banks that may be configured to replace different memory types, such as, for example, DRAM, flash, and PSRAM-flash MCP.

Figure 3:
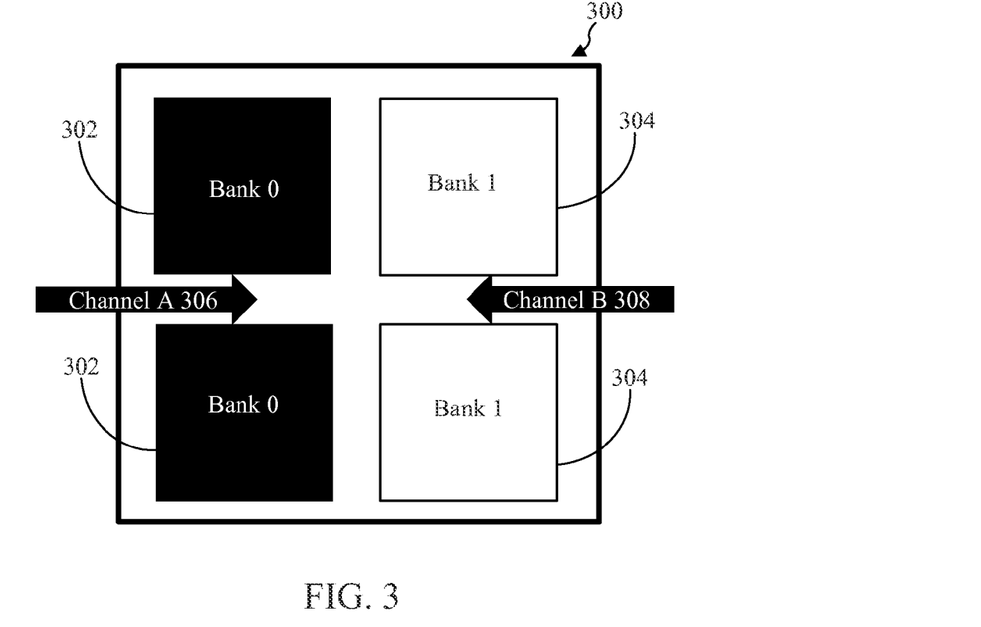
FIG. 3 illustrates an example of monolithic multi-tiered MRAM according to an aspect of the disclosure.

FIG. 3 illustrates an example of a multi-channel and multi-tiered STT-MRAM 300 according to an aspect of the present disclosure. As illustrated in FIG. 3 the STT-MRAM 300 includes a first set of banks (Bank 0) 302 and a second set of banks (Bank 1) 304. The first set of banks 302 may be accessed by a first channel 306 and the second set of banks may be accessed by a second channel 308. That is, the dual channels, i.e., the first channel 306 and the second channel 308, allow independent access to the different banks 302 and 304.

According to one aspect, each bank may be independently tuned (e.g., configured) based on various characteristics. As one example of the present aspect, the STT-MRAM 300 of FIG. 3 is configured to replace a DRAM chip and a flash chip. That is, the first set of banks 302 are configured for a DRAM interface and the second set of banks 304 are configured for a flash interface (e.g., NOR interface).

Specifically, for configuration as a DRAM interference, the first set of banks 302 are configured as a nonvolatile working memory block with high endurance and fast read/write cycles. Furthermore, the first set of banks 302 may be configured as a first bitcell type (in this example, tuned for DRAM specifications). It should be noted that nonvolatile refers to a memory that does not refresh. Moreover, for configuration as the flash interface, the second set of banks 304 may be configured as a storage memory block for long data retention (e.g., program code storage). According to the present aspect, the second set of banks 304 would operate faster in comparison to a typical flash chip. Furthermore, the second set of banks 304 may be configured as a second bitcell type (in this example, a high retention bitcell).

According to another example of the present aspect, the STT-MRAM 300 of FIG. 3 are configured to replace a PSRAM-flash MCP. That is, the first set of banks 302 are configured for a PSRAM interface and the second set of banks 304 are configured for a flash interface. Specifically, for configuration as the PSRAM interference, the first set of banks 302 are configured as a nonvolatile working memory block with a high endurance and fax read and write cycles. Furthermore, the first set of banks 302 are configured as a third bitcell type in this example, tuned for PSRAM specifications. Moreover, for configuration as the flash interface, the second set of banks 304 are configured as a storage memory block for long data retention (e.g., code storage). According to the present aspect, the second set of banks 304 would operate faster in comparison to a typical Flash chip. Furthermore, the second set of banks 304 may be configured as the second bitcell type.

Figure 4:
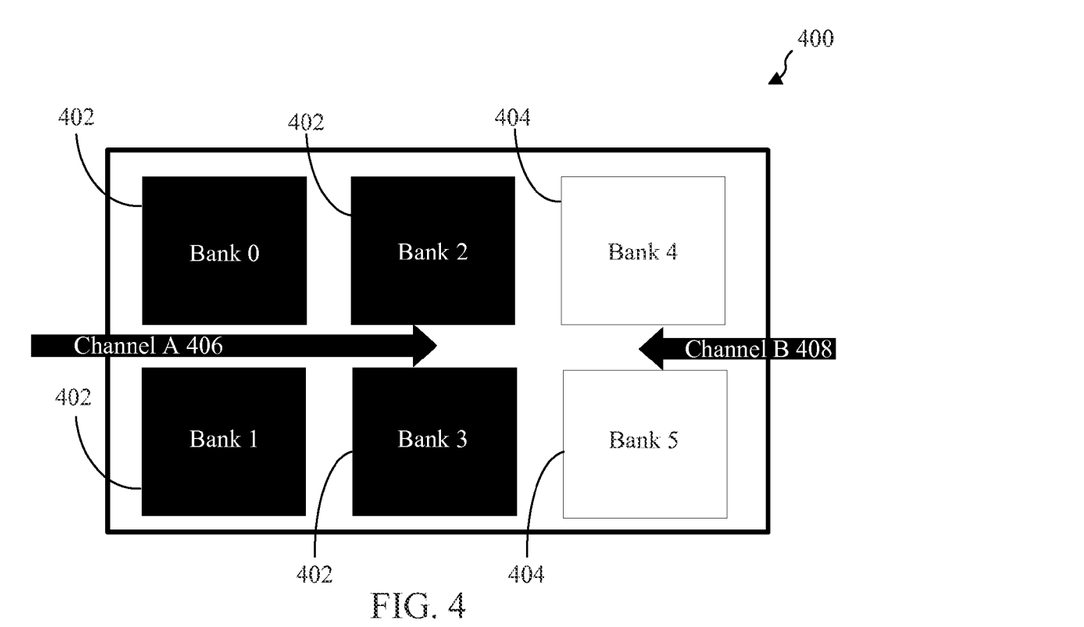
FIG. 4 illustrates an example of monolithic multi-tiered MRAM according to an aspect of the disclosure.

FIG. 4 illustrates an example of a multi-channel and multi-tiered STT-MRAM 400 according to an other aspect of the present disclosure. As illustrated in FIG. 4, the STT-MRAM 100 includes a first set of banks (Banks 0-3) 402 and a second set of banks (Banks 4 and 5) 404. The first set of banks 402 may be accessed by first channel 406 and the second set of banks may be accessed by a second channel 408. That is, the dual channels 406, 408 allow independent access to the different banks 402 and 404. Banks 0 and Bank 1 may be provided in a first tier whereas Bank 2 and Bank 3 may be provided in a second tier.

According to aspects of the present disclosure, the die area of the STT-MRAM 300 may be adjusted according to custom product applications. That is, the relative memory capacity may be adjusted. Furthermore, as illustrated in FIGS. 3 and 4, the bank configuration (internal and relative) may be adjustable. For example, FIG. 3 illustrates an aspect with two banks in the first set of banks 302 and two banks in the second set of banks 304. Moreover, FIG. 4 illustrates an aspect with four banks (Banks 0-3) in the first set of banks 102 and two banks (Banks 4 and 5) in the second set of banks 404. The bank configurations are not limited to the aspects illustrated in FIGS. 3 and 4, and may be adjusted as desired. The density range of the banks may be anywhere from tens of megabits (Mbits) to multi-gigabits (MGbits).

It should be noted that the aspect illustrated in FIG. 4 may be configurable similar to the aspects disclosed for FIG. 3. That is, the STT-MRAM 400 may be configured to replace, for example, a DRAM and flash two chips), or may be configured to replace a PSRAM-Flash MCP. The configurations of the STT-MRAM 400 are not limited to the aforementioned examples and the present disclosure contemplates other memory configurations.

According to an aspect of the disclosure, the monolithic multi-tier STT-MRAM may be fabricated by a process that maintains a baseline among the different tiers. The fabrication process includes a front-end-of-line (FEOL) and back-end-of line (BEOL) processes. Furthermore, the fabrication includes creating a magnetic tunnel junction (MTJ) materials stack.

Although a base line is maintained across the tiers, each tier (e.g., set of banks) may be configured according to various device options. A configurable device option may include a bitcell architecture, such as one transistor-one junction (1T-1J), two transistors-one junction (2T-1J), cross-point array, etc. Other configurable device options may be also include bitcell size, transistor size, MTJ size, or a combination thereof. The configurations of the device options may include permutations of all or some of the attributes listed above.

Furthermore, each tier may also be configured according to various circuit options. The configurable circuit options may include an operating voltage, input/output (IO) width, IO speed/frequency, array organization, redundancy, error correcting code (BCC), or a combination thereof. The configurations of the circuit options may include permutations of all or some of the attributes listed above. It should be noted that in the present disclosure attributes and options include parameters.

In some aspects, the STT-MRAM utilizes a homogeneous lower level process integration resulting in no extra process overhead because the different banks are simultaneously fabricated. That is, the same fabrication processes may be used for each type of STT-MRAM with only slight variation in the overall process flow. For example different mask layouts may be used within the same process flow to create the differently tuned banks.

It should be noted that although the aspects above are disclosed for a STY-MRAM, the aspects are not limited to a STT-MRAM and are contemplated for other memory types that are configurable similar to STT-MRAM.

Figure 5:
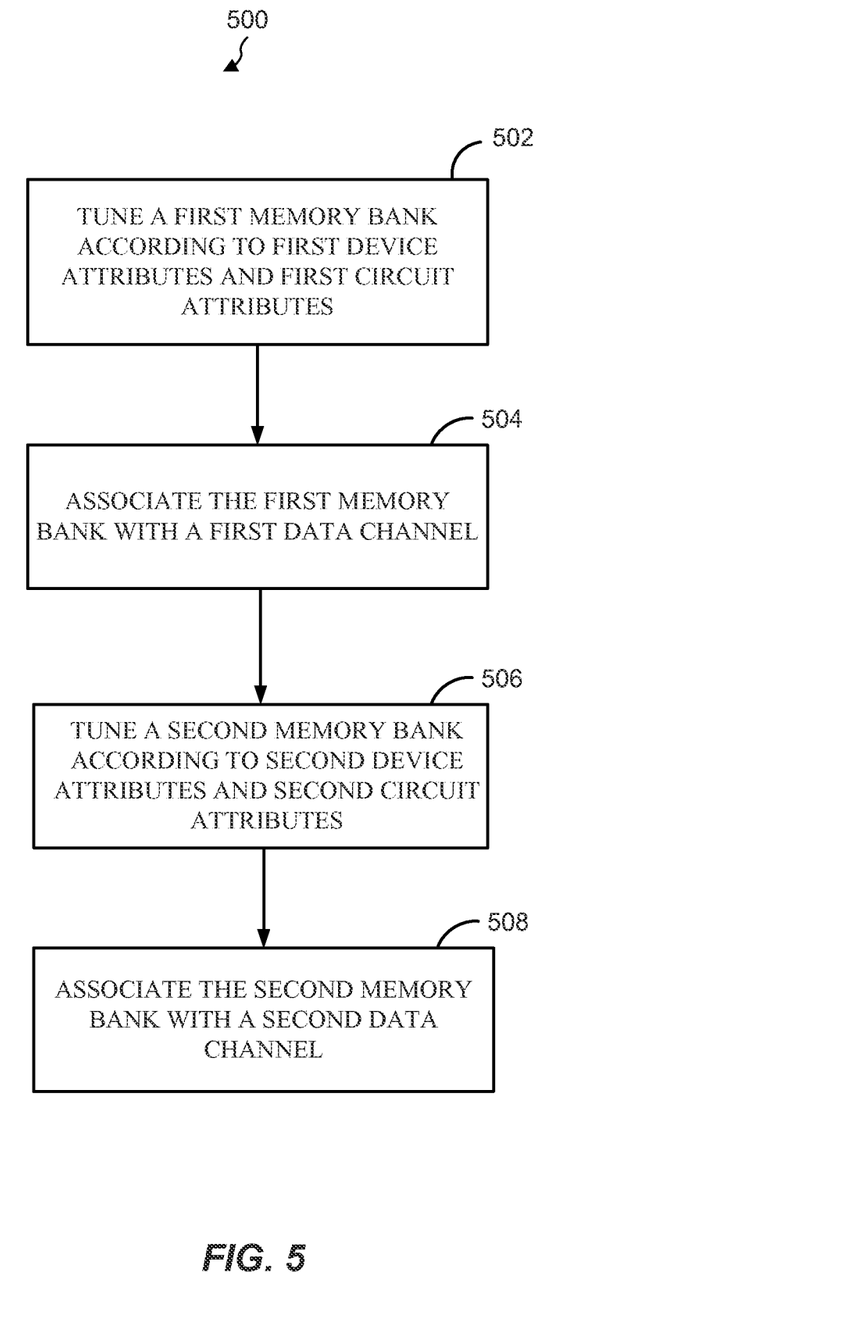
FIG. 5 is a block diagram of a method for fabricating a monolithic multi-tiered MRAM according to an aspect of the disclosure.

FIG. 5 illustrates a block diagram of a method 500 for tuning memory banks in a monolithic multi-channel resistive memory chip. As illustrated in FIG. 5, shown in block 502, a first memory bank is tuned according to first device attributes and first circuit attributes. As shown in block 504, the first memory bank is associated with a first data channel. Furthermore, as shown in block 506, a second memory bank is tuned according to second device attributes and second circuit attributes. Additionally, the second memory bank is associated with a second data channel, as shown in block 508.

Figure 6:
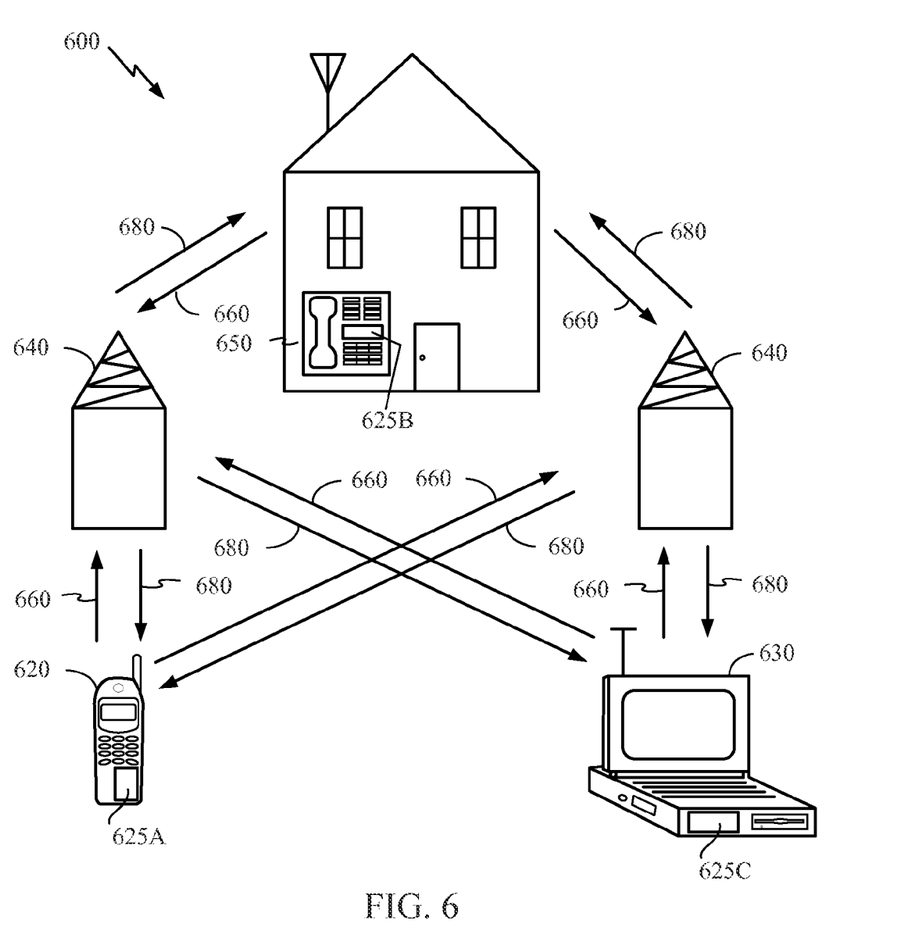
FIG. 6 illustrates an exemplary wireless communication system in which an embodiment of the disclosure may be advantageously employed.

FIG. 6 shows an exemplary wireless communication system 600 in which an embodiment of the disclosure may be advantageously employed. For purposes of illustration, FIG. 6 shows three remote units 620, 630, and 650 and two base stations 640. It will be recognized that wireless communication systems may have many more remote units and base stations. Remote units 620, 630, and 650 include monolithic multi-tiered STT-MRAM 625A, 625B, 625C. FIG. 6 shows forward link signals 660 from the base stations 640 and the remote units 620, 630, and 650 and reverse link signals 660 from the remote units 620, 630, and 650 to base stations 640.

In FIG. 6, the remote unit 620 is shown as a mobile telephone, remote unit 630 is shown as a portable computer, and remote unit 650 is shown as a fixed location remote unit in a wireless local loop system. For example, the remote units may be cell phones, hand-held personal communication systems (PCS) units, a set top box, a music player, a video player, an entertainment unit, a navigation device, portable data units, such as personal data assistants, or fixed location data units such as meter reading equipment. Although FIG. 6 illustrates remote units, which may employ monolithic multi-tiered STT-MRAM 625A, 625B, 625C according to the teachings of the disclosure, the disclosure is not limited to these exemplary illustrated units. For instance, monolithic multi-tiered STT-MRAM according to aspects of the present disclosure may be suitably employed in any device.

Figure 7:
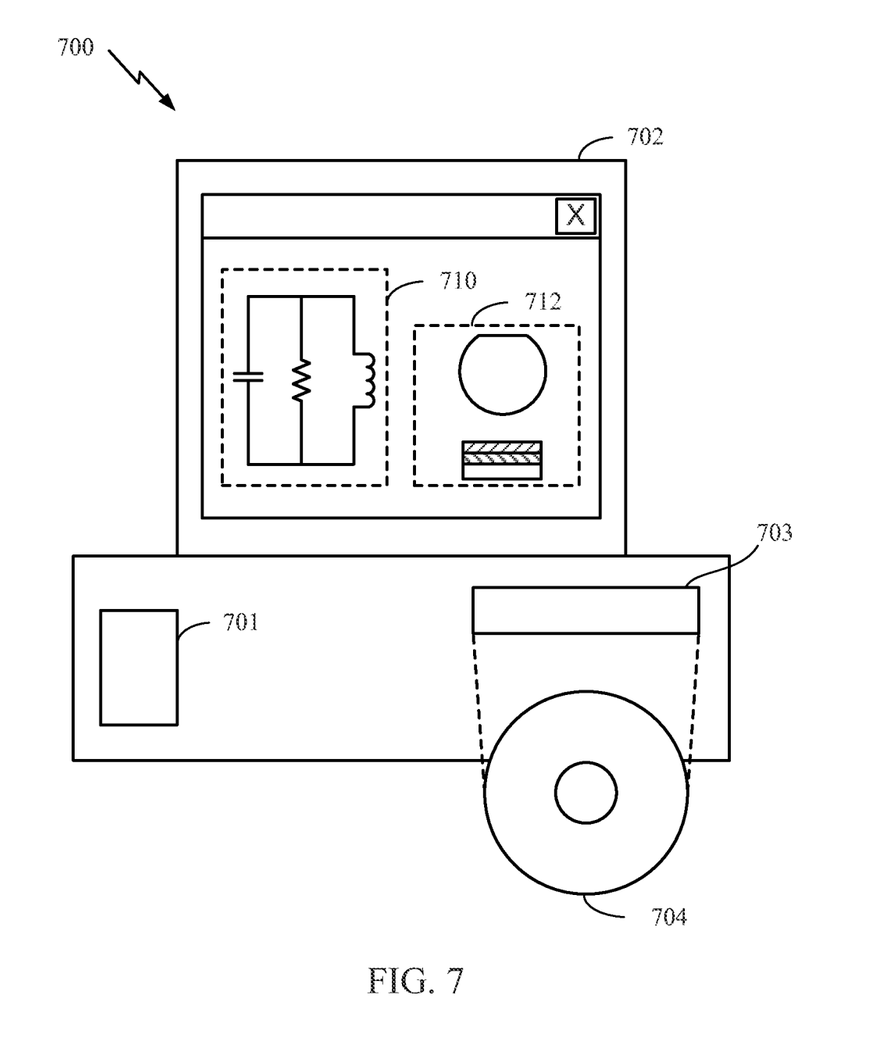
FIG. 7 is a block diagram illustrating a design workstation used for circuit, layout, and logic design of a semiconductor component according to one aspect of the present disclosure.

FIG. 7 is a block diagram illustrating a design workstation used for circuit, layout, and logic design of a semiconductor component, such as the monolithic multi-tiered STT-MRAM disclosed above. A design workstation 700 includes a hard disk 701 containing operating system software, support files, and design software such as Cadence or OrCAD. The design workstation 700 also includes a display 702 to facilitate design of a circuit 710 or a semiconductor component 712 such as a monolithic multi-tiered STT-MRAM. A storage medium 704 is provided for tangibly storing the circuit design 710 or the semiconductor component 712. The circuit design 710 or the semiconductor component 712 may be stored on the storage medium 704 in a file format such as GDSII or GERBER. The storage medium 704 may be a CD-ROM, DVD, hard disk, flash memory, or other appropriate device. Furthermore, the design workstation 700 includes a drive apparatus 703 for accepting input from or writing output to the storage medium 704.

Data recorded on the storage medium 704 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 704 facilitates the design of the circuit design 710 or the semiconductor component 712 by decreasing the number of processes for designing semiconductor wafers.

In one configuration, the memory apparatus includes at least one first storage means associated with a first channel and tuned according to first device attributes and/or first circuit attributes. The memory apparatus also includes at least one second storage means associated with a second channel and tuned according to second device attributes and/or second circuit attributes. The storage means may be the multi-tiered STT-MRAM 204, a first set of banks 302 402, and/or a second set of banks 304 404 configured to perform the functions recited by the storage means.

Although specific circuitry has been set forth, it will be appreciated by those skilled in the art that not all of the disclosed circuitry is required to practice the disclosed embodiments. Moreover, certain well known circuits have not been described, to maintain focus on the disclosure.

The methodologies described herein may be implemented by various means depending upon the application. For example, these methodologies may be implemented in hardware, firmware software, or any combination thereof. For a hardware implementation, the processing units may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic devices, other electronic units designed to perform the functions described herein, or a combination thereof.

For a firmware and/or software implementation, the methodologies may be implemented with modules (e.g., procedures, functions, and so on) that perform the functions described herein. Any machine or computer readable medium tangibly embodying instructions may be used in implementing the methodologies described herein. For example, software code may be stored in a memory and executed by a processor. When executed by the processor, the executing software code generates the operational environment that implements the various methodologies and functionalities of the different aspects of the teachings presented herein. Memory may be implemented within the processor or external to the processor. As used herein, the term "memory" refers to any type of long term, short term, volatile, nonvolatile, or other memory and is not limited to any particular type of memory or number of memories, or type of media upon which memory is stored.

The machine or computer readable medium that stores the software code defining the methodologies and functions described herein includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer. As used herein, disk and/or disc includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present teachings and their advantages have been described in detail, it should be understood that various changes, substitutions and alterations can be made herein without departing from the technology of the teachings as defined by the appended claims. Moreover, the scope of the present application is not intended to be limited to the particular aspects of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding aspects described herein may be used according to the present teachings. Accordingly, the appended claims are intended to include within their scope such processes, machines, manufacture, compositions of matter, means, methods, or steps.

What is claimed is:

1. A monolithic multi-channel magnetoresistive random-access memory (MRAM), comprising:
    at least one first set of banks comprising a first column of spin transfer torque magnetoresistive random-access memory (STT-MRAM) banks adjacent to each other and associated with a first channel, the first set of banks tuned according to first device attributes and/or first circuit attributes, as a first memory type, replacing one of a direct random access memory (DRAM), a flash memory and a pseudo static random access memory (PSRAM);
    at least one second set of banks comprising a second column of STT-MRAM banks adjacent to the first column of STT-MRAM banks without a processor in between and associated with a second channel, the second set of banks tuned according to second device attributes and/or second circuit attributes as a second memory type, replacing one of a DRAM, a flash memory and a PSRAM, and different from the first memory type; and
    a processor coupled to the first channel and the second channel in which the first channel provides the processor direct access to the first set of banks independent from direct processor access to the second set of banks through the second channel.

2. The memory of claim 1, in which the first device attributes and the second device attributes comprise at least a bitcell architecture, bitcell size, transistor size, and/or MTJ size.

3. The memory of claim 1, in which the first circuit attributes and the second circuit attributes comprise at least an operating voltage, input/output (IO) width, IO speed/frequency, array organization, redundancy, and/or error correcting code (ECC).

4. The memory of claim 1, further comprising at least one third bank associated with a third channel and tuned according to third device attributes and/or third circuit attributes.

5. The memory of claim 1, in which the memory is integrated in a mobile phone, a set top box, a music player, a video player, an entertainment unit, a navigation device, a computer, a hand-held personal communication systems (PCS) unit, a portable data unit, and/or a fixed location data unit.

6. A monolithic multi-channel magnetoresistive random-access memory (MRAM), comprising:
    at least one first storage means comprising a first column of spin transfer torque magnetoresistive random-access memory (STT-MRAM) banks adjacent to each other and associated with a first channel, the first storage means tuned according to first device attributes and/or first circuit attributes as a first memory type, replacing one of a direct random access memory (DRAM), a flash memory and a pseudo static random access memory (PSRAM);

at least one second storage means comprising a second column of STT-MRAM banks adjacent to the first column of STT-MRAM banks without a processor in between and associated with a second channel, the second storage means tuned according to second device attributes and/or second circuit attributes, as a second memory type, replacing one of a DRAM, a flash memory and a PSRAM, and different from the first memory type; and a processor coupled to the first channel and the second channel in which the first channel provides the processor with direct access to the first storage means independent from direct access to the second storage means through the second channel.

7. The memory of claim 6, integrated in a mobile phone, a set top box, a music player, a video player, an entertainment unit, a navigation device, a computer, a hand-held personal communication systems (PCS) unit, a portable data unit, and/or a fixed location data unit.

8. A method of associating memory banks with channels in a multi-channel monolithic multi-channel magnetoresistive random-access memory (MRAM), the method comprising:

a step of associating at least one first set of banks with a first channel, the first set of banks comprising a first column of spin transfer torque magnetoresistive random-access memory (STT-MRAM) banks adjacent to each other, the first set of banks tuned according to first device attributes and/or first circuit attributes, as a first memory type, replacing one of a direct random access memory (DRAM), a flash memory and a pseudo static random access memory (PSRAM);

a step of associating at least one second set of banks with a second channel, the second set of banks comprising a second column of STT-MRAM banks adjacent to the first column of STT-MRAM banks without a processor in between, the second set of banks tuned according to second device attributes and/or second circuit attributes as a second memory type, replacing one of a DRAM, a flash memory and a PSRAM, and different from the first memory type; and a step of directly accessing the first set of banks through the first channel independent from directly accessing the second set of banks through the second channel.

9. The method of claim 8, further comprising a step of integrating the memory in a mobile phone, a set top box, a music player, a video player, an entertainment unit, a navigation device, a computer, a hand-held personal communication systems (PCS) unit, a portable data unit, and/or a fixed location data unit.

10. A method of associating memory banks with channels in a monolithic multi-channel magnetoresistive random-access memory (MRAM), the method comprising:

associating at least one first set of banks with a first channel, the first set of banks tuned according to first device attributes and/or first circuit attributes, the first set of banks comprising a first column of spin transfer torque magnetoresistive random-access memory (STT-MRAM) banks adjacent to each other as a first memory type, replacing one of a direct random access memory (DRAM), a flash memory and a pseudo static random access memory (PSRAM);

associating at least one second set of banks with a second channel, the second set of banks tuned according to second device attributes and/or second circuit attributes, the second set of banks comprising a second column of STT-MRAM banks adjacent to the first column of STT-MRAM banks without a processor in between as a second memory type, replacing one of a DRAM, a flash memory and a PSRAM, and different from the first memory type; and directly accessing the first set of banks through the first channel independent from directly accessing the second set of banks through the second channel.

11. The method of claim 10, further comprising coupling the memory to a processor via the first channel and the second channel.

12. The method of claim 10, further comprising integrating the memory in a mobile phone, a set top box, a music player, a video player, an entertainment unit, a navigation device, a computer, a hand-held personal communication systems (PCS) unit, a portable data unit, and/or a fixed location data unit.

13. A method for fabricating memory banks for a monolithic multi-channel magnetoresistive random-access memory (MRAM), the method comprising:

tuning at least one first set of banks according to first device attributes and/or first circuit attributes, the first set of banks comprising a first column of spin transfer torque magnetoresistive random-access memory (STT-MRAM) banks adjacent to each other as a first memory type, replacing one of a direct random access memory (DRAM), a flash memory and a pseudo static random access memory (PSRAM);

tuning at least one second set of banks according to second device attributes and/or second circuit attributes, the second set of banks comprising a second column of STT-MRAM banks adjacent to the first column of STT-MRAM banks without a processor in between as a second memory type, replacing one of a DRAM, a flash memory and a PSRAM and the second memory type, and different from the first memory type; and directly accessing the first set of banks through a first channel independent from directly accessing the second set of banks through a second channel.

14. The method of claim 13, in which the first device attributes and the second device attributes comprise at least a bitcell architecture, bitcell size, transistor size, and/or MTJ size.

15. The method of claim 13, in which the first circuit attributes and the second circuit attributes comprise at least an operating voltage, input/output (IO) width, IO speed/frequency, array organization, redundancy, and/or error correcting code (ECC).

16. The method of claim 13, further comprising tuning at least one third bank according to third device attributes and/or third circuit attributes.

17. The method of claim 13, further comprising integrating the memory in a mobile phone, a set top box, a music player, a video player, an entertainment unit, a navigation device, a computer, a hand-held personal communication systems (PCS) unit, a portable data unit, and/or a fixed location data unit.

18. A method for fabricating memory banks for a monolithic multi-channel magnetoresistive random-access memory (MRAM), the method comprising:

a step of tuning at least one first set of banks according to first device attributes and/or first circuit attributes, the first set of banks comprising a first column of spin transfer torque magnetoresistive random-access memory (STT-MRAM) banks adjacent to each other as a first memory type, replacing one of a direct random access memory (DRAM), a flash memory and a pseudo static random access memory (PSRAM);

a step of tuning at least one second set of banks according to second device attributes and/or second circuit attributes, the second set of banks comprising a second column of STT-MRAM banks adjacent to the first column of STT-MRAM banks without a processor in between as a second memory type, replacing one of a DRAM, a flash memory and a PSRAM, and different from the first memory type; and a step of directly accessing the first set of banks through a first channel independent from directly accessing the second set of banks through a second channel.

19. The method of claim 18, further comprising a step of integrating the memory in a mobile phone, a set top box, a music player, a video player, an entertainment unit, a navigation device, a computer, a hand-held personal communication systems (PCS) unit, a portable data unit, and/or a fixed location data unit.

\* \* \* \* \*